United States Patent
Kesapragada et al.

(10) Patent No.: US 10,109,520 B2
(45) Date of Patent: Oct. 23, 2018

(54) METHODS FOR DEPOSITING DIELECTRIC BARRIER LAYERS AND ALUMINUM CONTAINING ETCH STOP LAYERS

(71) Applicant: APPLIED MATERIALS, INC., Santa Clara, CA (US)

(72) Inventors: Sree Rangasai V. Kesapragada, Union City, CA (US); Kevin Moraes, Fremont, CA (US); Srinivas Guggilla, San Jose, CA (US); He Ren, San Jose, CA (US); Mehul Naik, San Jose, CA (US); David Thompson, San Jose, CA (US); Weifeng Ye, Sunnyvale, CA (US); Yana Cheng, San Jose, CA (US); Yong Cao, San Jose, CA (US); Xianmin Tang, San Jose, CA (US); Paul F. Ma, Santa Clara, CA (US); Deenesh Padhi, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/285,011

(22) Filed: Oct. 4, 2016

(65) Prior Publication Data
US 2017/0098575 A1    Apr. 6, 2017

Related U.S. Application Data

(60) Provisional application No. 62/236,953, filed on Oct. 4, 2015.

(51) Int. Cl.
*H01L 21/768* (2006.01)
*H01L 21/02* (2006.01)

(52) U.S. Cl.
CPC .. *H01L 21/76832* (2013.01); *H01L 21/02126* (2013.01); *H01L 21/02167* (2013.01);
(Continued)

(58) Field of Classification Search
CPC ................................................ H01L 21/76829
See application file for complete search history.

(56) References Cited

U.S. PATENT DOCUMENTS 8,501,600 B2    8/2013  Sanchez et al.
9,299,605 B2    3/2016  Ren et al.
(Continued)

FOREIGN PATENT DOCUMENTS

WO    WO 2016/138284 A1    9/2016

OTHER PUBLICATIONS

Search Report and Written Opinion dated Jan. 26, 2017 for PCT Application No. PCT/US2016/055317.

*Primary Examiner* — Yu-Hsi D Sun
(74) *Attorney, Agent, or Firm* — Moser Taboada; Alan Taboada

(57) ABSTRACT

In some embodiments, a method of forming an interconnect structure includes selectively depositing a barrier layer atop a substrate having one or more exposed metal surfaces and one or more exposed dielectric surfaces, wherein a thickness of the barrier layer atop the one or more exposed metal surfaces is greater than the thickness of the barrier layer atop the one or more exposed dielectric surfaces. In some embodiments, a method of forming an interconnect structure includes depositing an etch stop layer comprising aluminum atop a substrate via a physical vapor deposition process; and depositing a barrier layer atop the etch stop layer via a chemical vapor deposition process, wherein the substrate is transferred from a physical vapor deposition chamber after depositing the etch stop layer to a chemical vapor deposition chamber without exposing the substrate to atmosphere.

14 Claims, 3 Drawing Sheets

(52) U.S. Cl.
CPC .. *H01L 21/02178* (2013.01); *H01L 21/02211* (2013.01); *H01L 21/76826* (2013.01); *H01L 21/76829* (2013.01); *H01L 21/76834* (2013.01)

(56) References Cited

U.S. PATENT DOCUMENTS

| | | |
|---|---|---|
| 2002/0019126 A1 | 2/2002 | Reinberg |
| 2008/0207007 A1 | 8/2008 | Thridandam et al. |
| 2011/0039061 A1 | 2/2011 | Fedynyshyn et al. |
| 2011/0263117 A1 | 10/2011 | Nam et al. |
| 2012/0252208 A1 | 10/2012 | Jang et al. |
| 2016/0322229 A1 | 11/2016 | Ganguli et al. |
| 2017/0278797 A1* | 9/2017 | Rha .................. H01L 21/76802 |

* cited by examiner

METHODS FOR DEPOSITING DIELECTRIC BARRIER LAYERS AND ALUMINUM CONTAINING ETCH STOP LAYERS

CROSS-REFERENCE TO RELATED APPLICATIONS

This application claims benefit of U.S. provisional patent application Ser. No. 62/236,953, filed Oct. 4, 2015, and which is herein incorporated by reference in its entirety.

FIELD

Embodiments of the present disclosure generally relate to methods of processing substrates.

BACKGROUND

Resistance capacitance (RC) delay is a significant roadblock in scaling copper interconnects beyond 14 nm technology nodes. A barrier layer is typically deposited substantially uniformly atop underlying metal and dielectric surfaces. However, barrier layer materials typically have a high k value and increase the capacitance of the interconnect resulting in RC delay.

Traditionally, thick barrier films, for example at a thickness of about 100 angstroms, have been used in order to meet etch stop, barrier and reliability parameters. However, a thick barrier film also results in an increase in overall capacitance of the interconnect. To reduce the thickness of the barrier film, a thin, high-selectivity etch stop layer (ESL), such as aluminum nitride (AlN) may be used within the interconnect. However, such thin, high-selectivity ESLs can easily be oxidized, leading to lower etch selectivity and also a degradation in reliability performance. In addition, the thinner dielectric barrier layer and the thin, high-selectivity ESL cannot act as a suitable hermetic and copper (Cu) barrier layers when deposited separately.

Accordingly, the inventors have developed improved techniques to selectively deposit dielectric barrier layers in the process of forming an interconnect and to deposit aluminum containing etch stop layers in the process of forming an interconnect.

SUMMARY

In some embodiments, a method of forming an interconnect structure includes: selectively depositing a barrier layer atop a substrate having one or more exposed metal surfaces and one or more exposed dielectric surfaces, wherein a thickness of the barrier layer atop the one or more exposed metal surfaces is greater than the thickness of the barrier layer atop the one or more exposed dielectric surfaces, wherein the barrier layer is selectively deposited by one of: modifying the one or more exposed dielectric surfaces to inhibit formation of the barrier layer atop the one or more exposed dielectric surfaces, or exposing the substrate to an atomic layer deposition process using chemical precursors predisposed to preferentially deposit the barrier layer atop the one or more exposed metal surfaces relative to the one or more exposed dielectric surfaces.

In some embodiments, a method of forming an interconnect structure includes: depositing an etch stop layer comprising aluminum atop a substrate via a physical vapor deposition process, wherein the substrate comprises one or more exposed metal surfaces and one or more exposed dielectric surfaces; subsequently transferring the substrate from the first process chamber to a second process chamber without exposing the substrate to atmosphere; and depositing a barrier layer atop the etch stop layer via a chemical vapor deposition process in the second process chamber.

In some embodiments, a non-transitory computer readable medium having instructions stored thereon that, when executed, cause a method of forming an interconnect structure to be performed. The method may include any of the embodiments disclosed herein Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
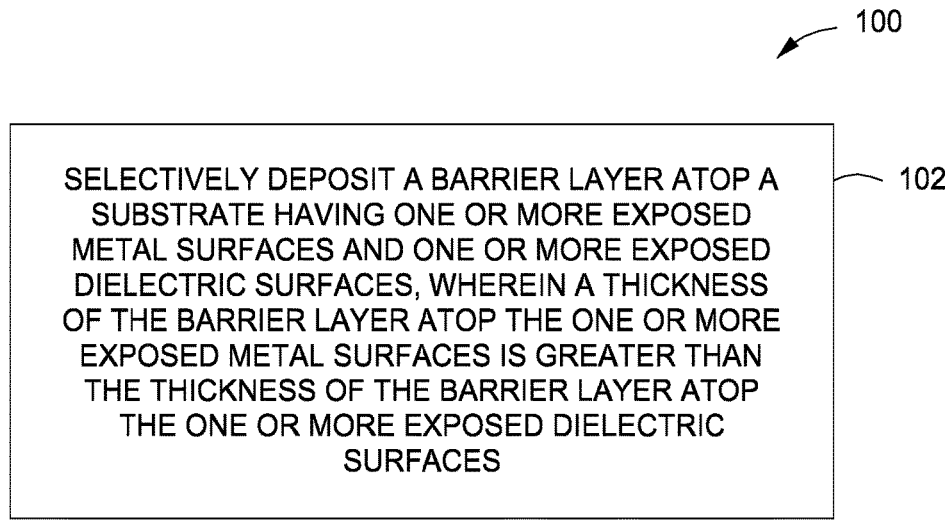
FIG. 1 depicts a flow chart of a method for forming an interconnect structure in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for forming an interconnect structure are provided herein. The inventive methods advantageously facilitate selectively depositing a barrier layer in the process of forming an interconnect to lower film thickness and reduce resistance capacitance (RC) delay while maintaining etch stop and barrier properties. The inventive methods also advantageously facilitate depositing aluminum containing etch stop layers in the process of forming an interconnect to minimizing RC delay. The inventive methods may be utilized in the formation of metal interconnects in an integrated circuit, or in the formation of a metal gate or a metal-contact gap fill process, as well as other suitable applications utilizing filling a feature with a conductive material.

Figure 2A:
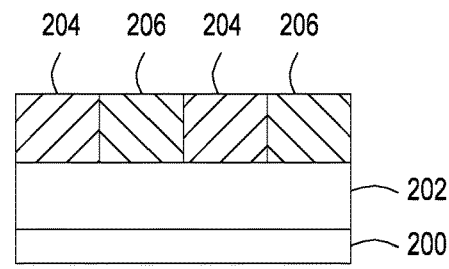
FIGS. 2A-2B depict stages of selectively depositing a dielectric barrier layer in accordance with some embodiments of the present disclosure.
Figure 2B:
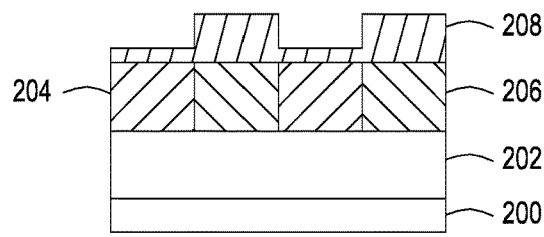

FIG. 1 depicts a flow chart of a method 100 for forming an interconnect structure in accordance with some embodiments of the present disclosure. The method 100 is described below with respect to an interconnect structure, as depicted in FIGS. 2A-2B. The method 100 may be performed in any suitable process chambers configured for one or more of chemical vapor deposition (CVD), physical vapor deposition (PVD), or atomic layer deposition (ALD). Exemplary processing systems that may be used to perform the inventive methods disclosed herein may include, but are not limited to, any of the ENDURA®, CENTURA®, or PRODUCER® line of processing systems, all commercially available from Applied Materials, Inc., of Santa Clara, Calif. Other process chambers, including ones available from other manufacturers, may also be suitably used in connection with the teachings provided herein.

The method 100 may be performed on a substrate, such as the substrate 200 depicted in FIG. 2A. In some embodiments, the substrate 200 includes one or more exposed metal surfaces 206 and one or more exposed dielectric surfaces 204. In some embodiments, the substrate 200 is used in a semiconductor manufacturing process. For example, the substrate 200 may comprise one or more of silicon (Si), germanium, silicon germanium, doped or undoped polysilicon, doped or undoped silicon wafers and patterned or non-patterned wafers silicon on insulator (SOI), doped silicon, or the like. The substrate 200 may have various dimensions, such as 200 mm, 300 mm or 450 mm diameter wafers or other dimensions. In addition, the substrate 200 may include additional layers 202 of materials or may have one or more completed or partially completed structures or devices formed in or on the substrate 200. In some embodiments, the one or more exposed metal surfaces 206 are one or more of copper, cobalt, tungsten, ruthenium, silver, or aluminum. In some embodiments, the one or more exposed dielectric surfaces 204 may be silicon oxide, a low-k dielectric material (e.g., a material having a dielectric constant less than silicon oxide, or less than about 3.9), or the like.

The method 100 begins at 102, as depicted in FIG. 2B, where a barrier layer 208 is selectively depositing atop the substrate 200. As used herein the term "selectively depositing" or "selective deposition" or the like means that a first amount of material is deposited on a first surface and a second amount of material is deposited on a second surface, where the second amount of material is less than the first amount of material. As depicted in FIG. 2B, a thickness of the barrier layer 208 atop the one or more exposed metal surfaces 206 is greater than the thickness of the barrier layer 208 atop the one or more exposed dielectric surfaces 204. As used herein a "barrier layer", such as barrier layer 208, is a layer that serves to stop underlying metal from diffusing upwards into subsequently deposited interconnect layers and can also act as an etch stop layer when etching openings into subsequently deposited interconnect layers. In some embodiments, the barrier layer 208 is a dielectric layer. In some embodiments, the barrier layer 208 is silicon carbon nitride (SiCN) or silicon oxycarbide (SiOC). In some embodiments, the thickness of the barrier layer 208 atop the one or more exposed metal surfaces 206 is about 0 to about 70 angstroms, or in some embodiments about 40 to about 70 angstroms. In some embodiments, the thickness of the dielectric layer atop the one or more exposed dielectric surfaces 204 is about 0 to about 40 angstroms, or in some embodiments about 10 to about 40 angstroms, or in some embodiments about 10 to about 20 angstroms.

The barrier layer 208 can be deposited by any process suitable to provide the barrier layer 208 at a suitable thickness. For example, in some embodiments, the barrier layer 208 may be formed via a deposition process, such as chemical vapor deposition (CVD), physical vapor deposition (PVD), or a cyclical deposition process, for example, such as atomic layer deposition (ALD), or the like.

In some embodiments, the barrier layer 208 can be selectively deposited by exposing the substrate to a treatment process configured to modify the one or more exposed dielectric surfaces 204 to inhibit or delay the formation of the barrier layer 208 atop the one or more exposed dielectric surfaces 204. The treatment process exposes the substrate to a treatment chemical, either in a solution phase or a vapor phase, which selectively binds to hydroxyl groups on the dielectric surface 204 relative to metal surfaces in order to inhibit or delay the formation of the barrier layer 208 atop the one or more exposed dielectric surfaces 204. Exemplary treatment chemicals include $(C_nH_{2n+2})_xSi(A)_{4-x}$ where n is an integer between 1 and 18, x is an integer between 1 and 3 and A is an anionic group selected from the family of dialkylamides, monoalkyl amides, chlorides, phosphates or the like. Exemplary processes that can be used to expose the substrate to the treatment chemical include chemical vapor deposition a cyclical deposition process, for example, such as atomic layer deposition (ALD).

In some embodiments, the barrier layer 208 can be selectively deposited by utilizing chemical precursors predisposed to deposit atop one or more exposed metal surfaces 206. Exemplary chemical precursors include alkylaminosilanes such as bis(diethylamino)silane (BDEAS), diisopropylaminosilane (DIPAS), tris(dimethylamino)silane (3-DMAS), silicon tetra-acetylide, and the like. Such precursors may be used in a thermal atomic layer deposition mode (ALD) mode along with reactant gases such as with ammonia ($NH_3$), hydrazine ($N_2H_4$), dimethylhydrazine, and hydrogen ($H_2$). Alternatively, such chemical precursors may be used in a plasma enhanced atomic layer deposition process (PEALD) where plasma is applied during the reactant pulse. Typical deposition temperatures for thermal and plasma ALD processes will be about 175 to about 450 degrees Celsius.

The inventors have observed that barrier layers are typically deposited substantially uniformly atop underlying metal and dielectric surfaces. However, the barrier layer 208 does not need to be deposited substantially uniformly atop the metal and dielectric surfaces to serve the purpose of the barrier layer. For example, the etch stop functionality of the barrier layer is only utilized atop an underlying dielectric portion while the barrier properties are only utilized atop an underlying metal portion. Accordingly, selectively depositing the barrier layer 208 such that the thickness of the barrier layer 208 atop the exposed metal surface 206 is greater than the thickness of the barrier layer 208 atop the dielectric surface 204 advantageously lowers film thickness and reduces RC delay while maintaining etch stop and barrier properties. In some embodiments, the inventors have observed that selectively depositing the barrier layer 208 as described in method 100 advantageously reduces the capacitance as compared to a blanket (e.g. uniform thickness) deposition of barrier layer 208 by about 5 to about 12 percent.

Following the method 100, the substrate 200 may proceed for further processing to complete formation of an integrated circuit. For example, in some embodiments, additional layers of material may be deposited to form the next metallization level.

Figure 4:
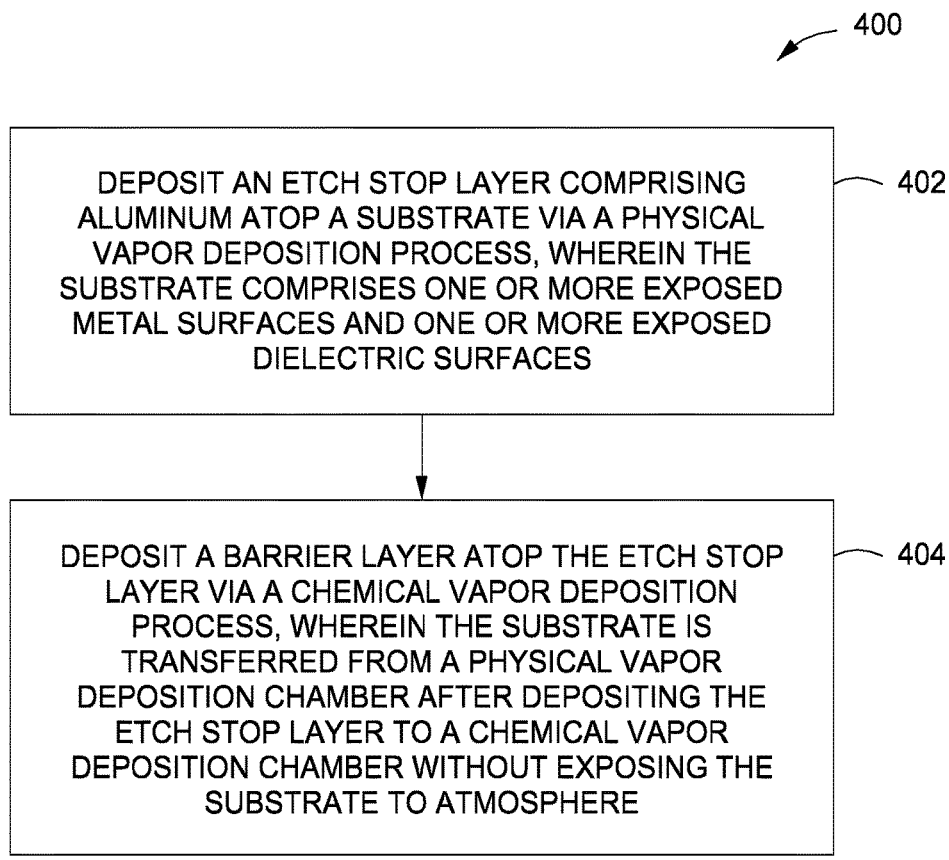
FIG. 4 depicts a flow chart of a method for forming an interconnect structure in accordance with some embodiments of the present disclosure.
Figure 5A:
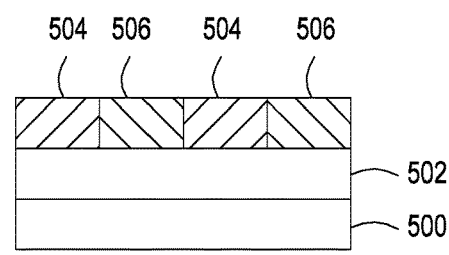
FIGS. 5A-5C depict stages of depositing an aluminum containing etch stop layer in accordance with some embodiments of the present disclosure.
Figure 5B:
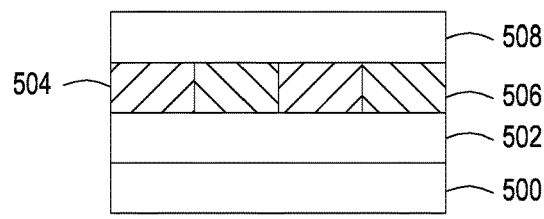
Figure 5C:
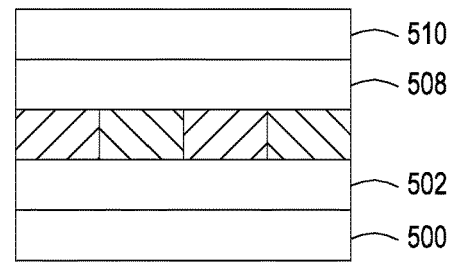

FIG. 4 depicts a flow chart of a method 400 for forming an interconnect structure in accordance with some embodiments of the present disclosure. The method 400 is described below with respect to an interconnect structure, as depicted in FIGS. 5A-5C. The method 400 may be performed in any suitable process chambers configured for one or more of chemical vapor deposition (CVD), physical vapor deposition (PVD), or atomic layer deposition (ALD). Exemplary processing systems that may be used to perform the inventive methods disclosed herein may include, but are not limited to, any of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including ones available from other manufacturers, may also be suitably used in connection with the teachings provided herein.

The method 400 may be performed on a substrate 500, as depicted in FIG. 5A. In some embodiments, the substrate 500 includes one or more exposed metal surfaces 506 and one or more exposed dielectric surfaces 504. In some embodiments, the substrate 500 is used in a semiconductor manufacturing process. For example, the substrate 500 may comprise one or more of silicon (Si), germanium, silicon germanium, doped or undoped polysilicon, doped or undoped silicon wafers and patterned or non-patterned wafers silicon on insulator (SOI), doped silicon, or the like. The substrate 500 may have various dimensions, such as 200 mm, 300 mm or 450 mm diameter wafers or other dimensions. In addition, the substrate 500 may include additional layers 502 of materials or may have one or more completed or partially completed structures or devices formed in or on the substrate 500. In some embodiments, the one or more exposed metal surfaces 506 are one or more of copper, cobalt, or tungsten. In some embodiments, the one or more exposed dielectric surfaces 504 may be silicon oxide, a low-k material (e.g., a material having a dielectric constant less than silicon oxide, or less than about 3.9), or the like.

The method 400 begins at 402, and as depicted in FIG. 5B, where an etch stop layer 508 is deposited atop the one or more exposed metal surfaces 506 and one or more exposed dielectric surfaces 504. The etch stop layer 508 comprises aluminum. In some embodiments, the etch stop layer 508 is aluminum nitride, aluminum oxide, or aluminum oxynitride. In some embodiments, a thickness of the etch stop layer is about 5 to about 25 angstroms, for example about 15 angstroms. The etch stop layer 508 is deposited via a physical vapor deposition (PVD) process in a PVD process chamber. For example, in some embodiments, the etch stop layer is deposited by providing a process gas to the PVD process chamber to physically sputter source from an aluminum target e.g., to cause the target to eject atoms of the target material, which are then directed towards the substrate 200. In some embodiments, the process gas may comprise at least one of a nitrogen containing gas, such as nitrogen ($N_2$) or an oxygen containing gas, such as oxygen ($O_2$). In some embodiments, the process gas may further comprise a noble gas, such as argon (Ar), helium (He), krypton (Kr), neon (Ne), xenon (Xe), or the like. The sputtered metal atoms react with the reactive plasma containing species of, for example, oxygen, nitrogen, carbon and/or hydrogen. In some embodiments, a plasma may be formed from the first process gas to facilitate sputtering the source material from the target. The plasma may be formed by coupling sufficient energy, for example radio frequency (RF) energy from a power source to ignite the first process gas to form the plasma.

The substrate may be subsequently transferred from the first process chamber to a second process chamber without exposing the substrate to atmosphere. A barrier layer can be deposited atop the etch stop layer in the second process chamber. For example, at 404 and as depicted in FIG. 5C, a barrier layer 510 is depositing atop the etch stop layer 508. In some embodiments, the barrier layer 510 is silicon carbon nitride (SiCN) or silicon oxycarbide (SiOC). In some embodiments, the thickness of the barrier layer 510 is about 20 angstroms to about 100 angstroms. The barrier layer 510 is formed via a chemical vapor deposition (CVD) process. General process conditions for barrier layer deposition include a chamber temperature of about 350 to about 450 degrees Celsius and process gases such as argon, nitrogen, and ammonia provided to the process chamber at a pressure of about 2 to about 4 Torr. In some embodiments, prior to depositing the barrier layer 510, the substrate is exposed to a process gas comprising at least one of a nitrogen-containing gas, an inert gas, and an oxygen-containing gas to improve the thermal stability of the interconnect structure. In some embodiments, the substrate is exposed to process has comprising one or more of nitrogen ($N_2$), ammonia ($NH_3$), hydrogen ($H_2$) and oxygen ($O_2$) in a plasma treatment process or in a thermal soak process.

The substrate 500 is transferred from a physical vapor deposition chamber after depositing the etch stop layer 508 to a chemical vapor deposition chamber to deposit the barrier layer 510, without exposing the substrate 500 to atmosphere. The inventors have observed that transferring the substrate 500 without exposure to the atmosphere prevents oxidation of the etch stop layer 508 which can lead to lower etch selectivity and also a degradation in electrical reliability performance. At the etch stop layer thicknesses described above, the entire etch stop layer may become oxidized, which can impact underlying metal line material as well as underlying low-k dielectric material, leading to increased RC delay. For example, for a scheme with an aluminum nitride (AlN) etch stop layer followed by a silicon carbon nitride (SICN) barrier layer, in-situ deposition in an integrated mainframe ensures significantly improved electro-migration performance. The use of thin aluminum nitride (AlN) layer (for example at the thickness range described above) can result in oxidation of the entire aluminum nitride (AlN) film. As a result, oxygen/moisture can further impact the underlying films (e.g. cobalt (Co) and copper (Cu)) in the metal line. In addition, as a thin aluminum nitride (AlN) layer is not hermetic, low k dielectric film can absorb moisture which is then difficult to remove even when exposed to medium to high temperature degas/anneal process before deposition of the barrier layer. The trapped moisture can then lead to oxidation of a tantalum nitride barrier material and subsequently to reliability issues. Thus, in process schemes with a dielectric barrier (e.g. SiCN, SiOC or combination thereof) formed first, followed by an etch stop layer (e.g. AlN, AlON, AlOx), in-situ deposition in an integrated mainframe ensures good hermetic barrier properties for an overall thinner stack which will in turn lower RC delay.

Figure 3:
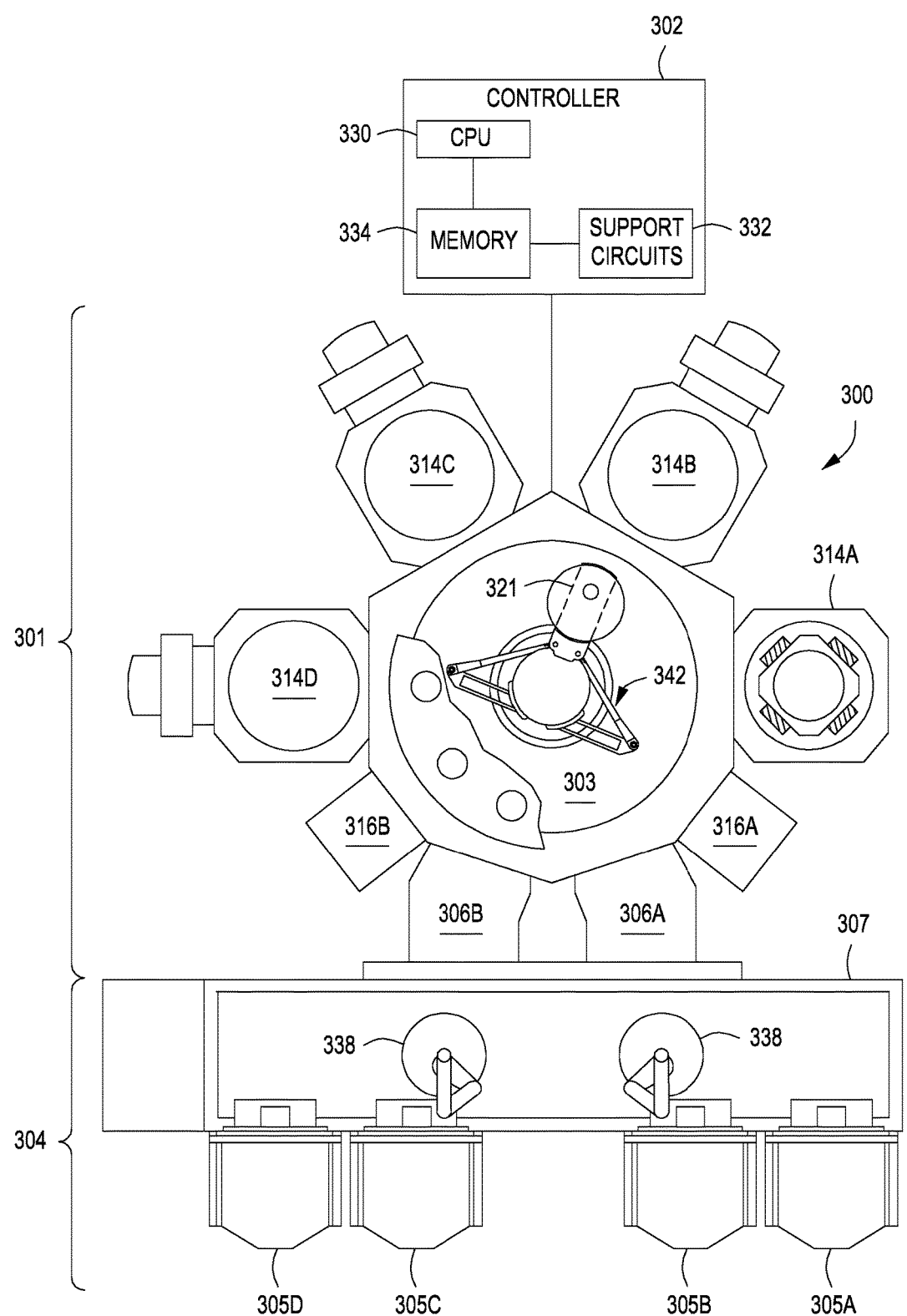
FIG. 3 depicts a cluster tool suitable to perform methods for processing a substrate in accordance with some embodiments of the present disclosure.

The methods described herein may be performed in individual process chambers that may be provided in a standalone configuration or as part of a cluster tool, for example, an integrated tool 300 (i.e., cluster tool) described below with respect to FIG. 3. Examples of the integrated tool 300 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks between processing steps. For example, reduced vacuum breaks may limit or prevent contamination of the seed layer or other portions of the substrate.

The integrated tool 300 includes a vacuum-tight processing platform (processing platform 301), a factory interface 304, and a system controller 302. The processing platform 301 comprises multiple process chambers, such as 314A, 314B, 314C, and 314D operatively coupled to a vacuum substrate transfer chamber (transfer chamber 303). The factory interface 304 is operatively coupled to the transfer chamber 303 by one or more load lock chambers (two load lock chambers, such as 306A and 306B shown in FIG. 4).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 4. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303. The load lock chamber 306A and 306B are coupled to a pressure control system (not shown) which pumps down and vents the load lock chambers 306A and 306B to facilitate passing the substrates between the vacuum environment of the transfer chamber 303 and the substantially ambient (e.g., atmospheric) environment of the factory interface 304. The transfer chamber 303 has a vacuum robot 342 disposed in the transfer chamber 303. The vacuum robot 342 is capable of transferring substrates 321 between the load lock chamber 306A and 306B and the process chambers 314A, 314B, 314C, and 314D.

In some embodiments, the process chambers 314A, 314B, 314C, and 314D, are coupled to the transfer chamber 303. The process chambers 314A, 314B, 314C, and 314D comprise at least a physical vapor deposition (PVD) chamber and a chemical vapor deposition (CVD) chamber. Additional chambers may also be provided such as additional CVD chambers, PVD chambers, annealing chambers, or the like. CVD and PVD chambers may include any chambers suitable to perform all or portions of the methods described herein, as discussed above.

In some embodiments, one or more optional service chambers (shown as 316A and 316B) may be coupled to the transfer chamber 303. The service chambers 316A and 316B may be configured to perform other substrate processes, such as degassing, orientation, substrate metrology, cool down and the like.

The system controller 302 controls the operation of the tool 300 using a direct control of the process chambers 314A, 3146, 314C, and 314D or alternatively, by controlling the computers (or controllers) associated with the process chambers 314A, 314B, 314C, and 314D and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be any form of a general purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (system controller) 302. The software routines may also be stored and/or executed by a second controller (not shown) that is located remotely from the tool 300.

While the foregoing is directed to embodiments of the present disclosure, other and further embodiments of the disclosure may be devised without departing from the basic scope thereof.

The invention claimed is:

1. A method of forming an interconnect structure, comprising:
    selectively depositing a barrier layer atop a substrate having one or more exposed metal surfaces and one or more exposed dielectric surfaces, wherein a thickness of the barrier layer atop the one or more exposed metal surfaces is greater than the thickness of the barrier layer atop the one or more exposed dielectric surfaces, and wherein the barrier layer is selectively deposited by:
    modifying the one or more exposed dielectric surfaces to inhibit formation of the barrier layer atop the one or more exposed dielectric surfaces by exposing the substrate to a treatment chemical which selectively binds to hydroxyl groups on the one or more exposed dielectric surface relative to the one or more exposed metal surfaces, or exposing the substrate to an atomic layer deposition process using chemical precursors predisposed to preferentially deposit the barrier layer atop the one or more exposed metal surfaces relative to the one or more exposed dielectric surfaces.

2. The method of claim 1, wherein the barrier layer is selectively deposited by modifying the one or more exposed dielectric surfaces by exposing the substrate to a treatment chemical which selectively binds to hydroxyl groups on the one or more exposed dielectric surface relative to the one or more exposed metal surfaces.

3. The method of claim 2, wherein the treatment chemical has a formula $(C_nH_{2n+2})_xSi(A)_{4-x}$, wherein n is an integer between 1 and 18, x is an integer between 1 and 3, and A is an anionic group selected from one of dialkylamides, monoalkyl amides, chlorides, or phosphates.

4. The method of claim 1, wherein the chemical precursors are bis(diethylamino)silane (BDEAS), diisopropylaminosilane (DIPAS), tris(dimethylamino)silane (3-DMAS), or silicon tetra-acetylide.

5. The method of claim 1, wherein the one or more exposed metal surfaces are one or more of copper, cobalt, tungsten, ruthenium, silver, or aluminum.

6. The method of claim 1, wherein the one or more exposed dielectric surfaces are a low-k dielectric material.

7. The method of claim 1, wherein the barrier layer is silicon carbon nitride (SiCN) or silicon oxycarbide (SiOC).

8. The method of claim 1, wherein the thickness of the barrier layer atop the one or more exposed metal surfaces is about 0 to about 70 angstroms.

9. The method of claim 1, wherein the thickness of the barrier layer atop the one or more exposed dielectric surfaces is about 0 to about 40 angstroms.

10. A non-transitory computer readable medium having instructions stored thereon that, when executed, cause a method for forming an interconnect structure, the method comprising:
    selectively depositing a barrier layer atop a substrate having one or more exposed metal surfaces and one or more exposed dielectric surfaces, wherein a thickness of the barrier layer atop the one or more exposed metal surfaces is greater than the thickness of the barrier layer atop the one or more exposed dielectric surfaces, and wherein the barrier layer is selectively deposited by:
    modifying the one or more exposed dielectric surfaces to inhibit formation of the barrier layer atop the one or more exposed dielectric surfaces by exposing the substrate to a treatment chemical which selectively binds to hydroxyl groups on the one or more exposed dielectric surface relative to the one or more exposed metal surfaces, or exposing the substrate to an atomic layer deposition process using chemical precursors predisposed to preferentially deposit the barrier layer atop the one or more exposed metal surfaces relative to the one or more exposed dielectric surfaces.

11. The non-transitory computer readable medium of claim 10, wherein the barrier layer is selectively deposited by modifying the one or more exposed dielectric surfaces by exposing the substrate to a treatment chemical which selectively binds to hydroxyl groups on the one or more exposed dielectric surface relative to the one or more exposed metal surfaces.

12. The non-transitory computer readable medium of claim 11, wherein the treatment chemical has a formula $(C_nH_{2n+2})_xSi(A)_{4-x}$, wherein n is an integer between 1 and 18, x is an integer between 1 and 3, and A is an anionic group selected from one of dialkylamides, monoalkyl amides, chlorides, or phosphates.

13. The non-transitory computer readable medium of claim 10, wherein the chemical precursors are bis(diethylamino)silane (BDEAS), diisopropylaminosilane (DIPAS), tris(dimethylamino)silane (3-DMAS), or silicon tetraacetylide.

14. The non-transitory computer readable medium of claim 10, wherein the thickness of the barrier layer atop the one or more exposed metal surfaces is about 0 to about 70 angstroms and wherein the thickness of the barrier layer atop the one or more exposed dielectric surfaces is about 0 to about 40 angstroms.

* * * * *